United States Patent [19]

Tam et al.

[11] Patent Number: 4,857,481
[45] Date of Patent: Aug. 15, 1989

[54] METHOD OF FABRICATING AIRBRIDGE METAL INTERCONNECTS

[75] Inventors: Gordon Tam, Chandler, Ariz.; Lisa R. Granick, Philadelphia, Pa.

[73] Assignee: Motorola, Inc., Schaumburg, Ill.

[21] Appl. No.: 322,943

[22] Filed: Mar. 14, 1989

[51] Int. Cl.⁴ .......................................... H01L 21/283
[52] U.S. Cl. ................................. 437/182; 437/192; 437/230; 437/927
[58] Field of Search ............... 437/187, 189, 192, 927, 437/230, 182; 148/DIG. 73; 156/652, 661.1

[56] References Cited

U.S. PATENT DOCUMENTS

| | | | |
|---|---|---|---|
| 3,890,177 | 6/1975 | Pfahnl et al. | 437/182 |
| 4,289,846 | 9/1981 | Parks et al. | 437/245 |
| 4,665,610 | 5/1987 | Barth | 357/26 |

FOREIGN PATENT DOCUMENTS

| | | | |
|---|---|---|---|
| 55-123138 | 9/1980 | Japan | 437/182 |
| 62-177943 | 8/1987 | Japan | 437/927 |

Primary Examiner—Olik Chaudhuri
Attorney, Agent, or Firm—Joe E. Barbee

[57] ABSTRACT

An improved method of fabricating airbridge metal interconnects uses two photoresist layers having different solubility characteristics. This allows for the removal of one resist without affecting the other. Thus, the underlying semiconductor structure is protected from subsequent etches of the ground plane metal. Consequently, a greater process latitude allows for obtaining higher device yields in fabricating high frequency semiconductor devices employing airbridge metal interconnects.

9 Claims, 1 Drawing Sheet

METHOD OF FABRICATING AIRBRIDGE METAL INTERCONNECTS

BACKGROUND OF THE INVENTION

This invention relates, in general, to manufacturing semiconductor devices and, more particularly, to a method of making airbridge metal interconnects on semiconductor devices.

Airbridge metal interconnects are typically employed in gallium arsenide devices, such as microwave integrated circuits. Gallium arsenide devices are used in high frequency applications. The performance of high frequency integrated circuits is significantly reduced if high parasitic capacitances are present. Airbridge technology reduces parasitic capacitances, thus permits high frequency integrated circuits, greater than 1 GHz, to function with lower loss and a higher gain than those fabricated with non-airbridge technologies. An airbridge metal interconnect is one in which the typical dielectric layer is replaced by air. Using nitride or oxide as a dielectric layer is not acceptable in high frequency devices because the high parasitic capacitances of nitride or oxide result in unacceptable high loss and low gain.

In the past, airbridges have been fabricated by applying a bottom photoresist layer to the surface of the device structure. Subsequently, the bottom photoresist layer is patterned and a thin metal ground plane is evaporated onto the surface. Another layer of photoresist is applied and patterned over the metal ground plane A thick layer of metal is then electroplated in the openings of the top photoresist. A problem then arises when removing the top photoresist layer; the developer or solvent used to remove the top photoresist layer also dissolves the bottom photoresist layer through the sides of the structure and through the thin metal ground plane. The ground plane metal, typically comprised of titanium and gold, is then removed with hydrofluoric acid and a cyanide based acid called Technistrip. Hydrofluoric acid is an etchant for titanium, but it also etches nitride, thus any nitride on the underlying device surface is also etched if there are regions in the bottom photoresist layer which have been dissolved. The cyanide based acid etches gold, thus other gold on the underlying device structure is also etched. This will result in poor device yields. Thus, there is a need to provide a method of forming airbridge metal interconnects where the underlying semiconductor device structure is not disturbed.

One such method involves using an ion-miller process to remove the top photoresist layer and ground plane metal. The ionic milling etches only in the vertical direction, thus does not attack the bottom photoresist through the sides. Using an ion-miller process is effective, however, is more expensive than using solvents and wet etches to remove the top photoresist layer and the metal ground plane. In addition, an ion-miller process can potentially leave metal residue over the wafer. Other methods of fabricating airbridge metal interconnects use a photoresist lift-off technique. Lift-off techniques, however, do not have good process latitude for thick metal. Thus, methods other than lift-off techniques are desirable to increase yield.

By now, it should be appreciated that it would be advantageous to provide a method of fabricating airbridge metal interconnects with an improved process yield.

Accordingly, it is an object of the present invention to provide an airbridge metal interconnect process which produces stable airbridge structures.

Another object of the present invention is to provide a method of fabricating airbridge interconnects without etching of the underlying device structures.

An additional object of the present invention is to provide an improved method of fabricating airbridge interconnects which has good process latitude, thereby leading to higher device yields and the ability to make high frequency devices.

SUMMARY OF THE INVENTION

In accordance with the present invention, the above and other objects and advantages are achieved by providing a method of fabricating an airbridge metal interconnect by using two photoresists having different solubility characteristics. A first photoresist layer is deposited onto a semiconductor device structure and is then patterned. A metal ground plane is then formed on the surface of the first photoresist layer and the device structure. A second photoresist layer, different than the first photoresist layer, is then deposited and patterned. Subsequently, a metal interconnect is formed on the exposed metal ground plane. The second photoresist layer is removed, without dissolving the first photoresist layer, since it has different solubility characteristics. The metal ground plane is then wet etched without etching the underlying semiconductor structure. Thus, stable metal interconnect layers are formed with high yields.

The preferred embodiments of the present invention are illustrated in the accompanying drawings for purposes of exemplification, and are not to be construed as limiting in any manner.

DETAILED DESCRIPTION OF THE DRAWINGS

Figure 1:
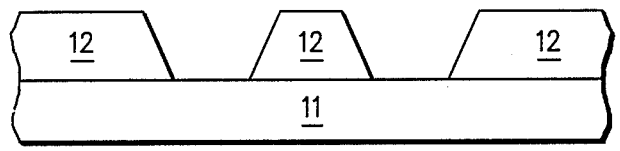
FIGS. 1–7 illustrate enlarged cross-sectional views of a portion of a semiconductor structure embodying the present invention in various stages of development.

FIG. 1 illustrates a semiconductor device structure at a intermediate step in the fabrication process. Device structure 10 illustrates a substrate 11 with a polymer 12 applied and patterned on its surface. Substrate 11 is an integrated circuit structure in the final stages of fabrication. In a preferred embodiment, polymer 12 is a positive photoresist layer. A positive photoresist layer is used only to obtain good definition, otherwise a negative photoresist layer may also be used. Here, a positive photoresist layer S2400-33 provided by the Shipley Company is used. The thickness of photoresist layer 12 determines the spacing of the airbridge metal interconnect to be formed; a thickness of approximately 2 to 3 microns is used in this embodiment.

Figure 2:
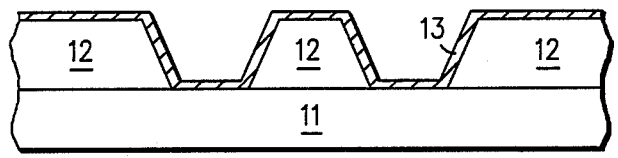

FIG. 2 illustrates device structure 10 of FIG. 1 with a metal ground plane 13 formed on the surface. Metal ground plane 13 can be formed by suitable techniques known in the art, such as evaporation, sputter, or the like. Metal ground plane 13 is preferably comprised of a titanium layer and a gold layer. The titanium provides good adhesion to the surface of semiconductor substrate 11, and the gold acts as a good conductor. The total thickness of metal ground plane 13 is shown to be approximately 800 angstroms, however other thicknesses may be readily used.

Figure 3:
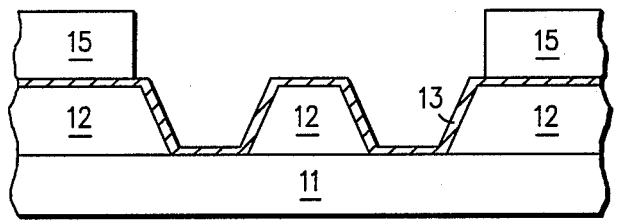

FIG. 3 illustrates device structure 10 of FIG. 2 with a second polymer 15 applied and patterned on the surface of substrate 11 to leave portions of metal ground plane 13 exposed. In a preferred embodiment, polymer 15 is also a positive photoresist layer. Photoresist layer 15 must have different solubility characteristics than photoresist layer 12. Suitable solvent or developer solutions used to remove photoresist layer 15 should not be able to remove any portion of photoresist layer 12. For example, one such photoresist layer 15 which has different solubility characteristics than photoresist layer 12 is a positive photoresist provided by the American Hoechst Corporation, called AZ4330. The thickness of photoresist layer 15 is determined by the desired thickness of metal layer 16 illustrated in FIG. 4. For purposes of exemplification, the thickness of photoresist layer 15 is shown to be approximately 3 microns.

Figure 4:
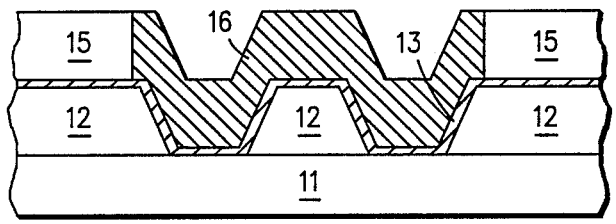

FIG. 4 illustrates device structure 10 of FIG. 3 having a metal layer 16 formed on the exposed surface of metal ground plane 13. Metal layer 16 is preferably electroplated onto the exposed portion of metal ground plane 13. Metal layer 16 can be made of gold or another metal which is a good conductor. The thickness of metal layer 16 is determined by the application of semiconductor device 10. For lower frequency applications, a metal layer 16 having a thickness of approximately 3 microns is desirable.

Figure 5:
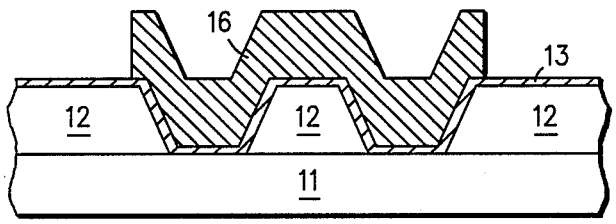

FIG. 5 illustrates device structure 10 of FIG. 4 with photoresist layer 15 removed. Photoresist layer 15 is removed with a suitable developer or solvent. For example, a Microposit developer, supplied by the Shipley Company, can be used to remove photoresist layer 15 without affecting photoresist layer 12.

Figure 6:
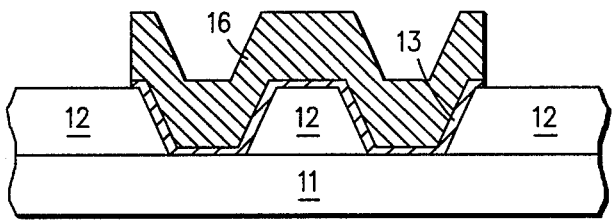

FIG. 6 illustrates device structure 10 with an exposed portion of metal ground plane 13 removed. Ground plane 13 is preferably removed with a wet etch. The gold layer in ground plane 13 can be removed with cyanide base acid called Technistrip, while the titanium may be removed in a hydrofluoric acid. In the present invention, the hydrofluoric acid nor the Technistrip are able to attack the surface of substrate 11 because photoresist layer 12 is fully intact. Other etchants may be also be used without affecting the surface of substrate 11.

Figure 7:
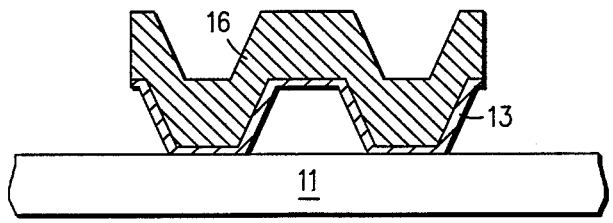

FIG. 7 illustrates device structure 10 of FIG. 6 with photoresist layer 12 removed. Photoresist layer 12 can be removed by using a suitable developer or solvent. For example, acetone may be used to remove photoresist layer 12.

What is thus formed is a stable airbridge metal interconnect comprised of metal layers 13 and 16 which can be fabricated with high yield. The airbridge interconnect is shown to make contact to the surface of substrate 11 in two places, with the space between the contacts being air instead of a typical dielectric layer such as nitride or oxide. The length of the airbridge metal interconnect is typically approximately 150 microns in length. This allows for obtaining low parasitic capacitances, thereby increasing performance of the semiconductor device.

By now it should be appreciated that there has been provided a new and improved method of fabricating airbridge metal interconnects which provides for stable metal interconnects and a high yield in fabricating integrated circuits used in high frequency applications.

We claim:

1. A method of fabricating an airbridge metal interconnect, comprising the steps of:

providing a semiconductor substrate;
applying a first polymer to the substrate;
patterning the first polymer to provide openings therein;
forming a first metal layer on the first polymer and on the substrate through the openings in the first polymer;
applying a second polymer on the first metal layer, the second polymer having different solubility characteristics than the first polymer;
patterning the second polymer to provide openings therein;
forming a second layer of metal onto a portion of the first metal layer through the openings of the second polymer;
removing the second polymer with a solution which does not dissolve the first polymer;
removing the first metal layer not underneath the second metal layer; and
removing the first polymer, thereby forming the airbridge metal interconnect.

2. The method of claim 1 wherein the first polymer has a thickness of approximately 2 to 3 microns, which determines the thickness of the airbridge metal interconnect.

3. The method of claim 1 wherein the solution used to remove the second polymer is a developer which does not remove the first polymer.

4. The method of claim 1 wherein the solution used to remove the second polymer is a solvent which does not remove the first polymer.

5. The method of claim 1 wherein the first metal layer is comprised of titanium and gold having a total thickness of approximately 800 angstroms, and the second metal layer is comprised of gold having a thickness of approximately 3 microns.

6. The method of claim 1 wherein the first and the second polymer are positive photoresists layers.

7. A method of fabricating an airbridge metal interconnect, comprising the steps of:

providing a semiconductor substrate;
applying a first photoresist layer to the substrate;
patterning the first photoresist layer to provide at least two openings therein;
evaporating a first metal layer onto the first photoresist layer and the substrate through the openings in the first photoresist layer;
applying a second photoresist layer on the first metal layer, the second photoresist layer having different solubility characteristics than the first photoresist layer;
patterning the second photoresist layer to provide openings therein, the openings in the second photoresist layer being positioned over at least two openings in the first photoresist layer;
electroplating a second metal layer onto an exposed portion of the first metal layer through the openings in the second photoresist layer;
removing the second photoresist layer with a developer, a solvent, or the like which does not dissolve the first photoresist layer;
removing the first metal layer not underneath the second metal layer; and
removing the first polymer, thereby forming the airbridge metal interconnect.

8. The method of claim 7 wherein the first photoresist layer has a thickness of approximately 2 to 3 microns, which determines the thickness of the airbridge.

9. The method of claim 7 wherein the first and the second photoresist layer are positive photoresist layers.

* * * * *